(12) United States Patent
Morande et al.

(10) Patent No.: US 6,295,444 B1
(45) Date of Patent: Sep. 25, 2001

(54) NON-PREDICTIVE TONE-CODED-SQUELCH FREQUENCY DETERMINATION METHOD

(75) Inventors: Craig J. Morande, Coral Springs; David L. Ellis, II, Coconut Creek, both of FL (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/431,413

(22) Filed: Nov. 1, 1999

(51) Int. Cl.$^7$ ............................... H04Q 7/00; H04B 1/10
(52) U.S. Cl. ........................................ 455/218; 455/226.1
(58) Field of Search .................................. 455/35.1, 36.1, 455/37.1, 218, 224, 226.1, 67.1, 423, 212, 213, 214; 379/282, 283, 351, 386

(56) References Cited

U.S. PATENT DOCUMENTS

| | | | |
|---|---|---|---|
| 4,783,845 | * 11/1988 | McChesney et al. | 455/35.1 |
| 5,303,408 | * 4/1994 | Ghomeshi et al. | 455/222 |
| 5,842,119 | * 11/1998 | Emerson et al. | 455/161.3 |
| 5,850,438 | * 12/1998 | Braams et al. | 379/386 |
| 5,881,101 | * 3/1999 | Furman et al. | 375/217 |

* cited by examiner

Primary Examiner—Vivian Chang
Assistant Examiner—Duc Nguyen
(74) Attorney, Agent, or Firm—Frank M. Scutch, III

(57) ABSTRACT

A non-predictive tone-coded-squelch (TCS) frequency determination method of scanning a plurality of radio frequency channels in a radio receiver and determining the presence of a standard tone-coded squelch frequency on the radio frequency channel (205) that includes determining a mathematical average of a plurality of subaudible tone samples from a radio frequency channel (211, 217) and then removing out-lying samples that differ from the mathematical average by some predetermined amount (219). A determination is made if the number of remaining samples is at least some predetermined percentage of the total samples taken (223) and a predictive tone-coded squelch detector is used to monitor for a standard tone-coded squelch frequency nearest to the a frequency corresponding to the mathematical average of the remaining samples (225) if the number of remaining samples is at least some predetermined percentage of the total samples taken. The receiver then returns to the standard tone-coded squelch frequency if detected by the predictive detector (227, 229).

3 Claims, 2 Drawing Sheets

NON-PREDICTIVE TONE-CODED-SQUELCH FREQUENCY DETERMINATION METHOD

TECHNICAL FIELD

This invention relates in general to two-way radio and more particularly to tone-coded-squelch signaling frequency determination.

BACKGROUND

Radio scanning is a typical operation included in two-way radios to allow users to rapidly scan multiple channels. Many applications of radio scan require that once a radio detects qualified channel activity, the user should be able to listen and answer back on that channel.

Typically, two-way radios provide the option of using tone-coded-squelch (TCS) signaling during transmissions and receptions. This subaudible signaling reduces false squelch bursts and squelch tails. If a scanning radio detects radio frequency (RF) channel activity that uses TCS signaling, in order for the user to be able to answer back, the radio must determine the TCS frequency being used on the RF channel.

Methods that can accurately determine the presence of a single particular TCS frequency (i.e., predictive TCS frequency determination) on a channel do exist. Scanning with these predictive TCS frequency determination methods can be relatively efficient if the radio is scanning particular RF channels looking for a single TCS frequency. However, if the TCS frequency is unknown and the radio is essentially scanning all possible standard TCS frequencies on particular RF channels, accurately determining the TCS frequency can be time consuming.

As seen in prior art FIG. 1, scanning starts 101 where the receiver is set up on a specific channel 103. If no radio RF carrier 105 is detected, the next channel is selected 107 and the receiver is set up on the next channel 103. The channels are scanned iteratively 103, 105, 107 from a list until a carrier is detected. Upon completion of scanning the list, scanning continues again from the beginning of the list. If an RF carrier is detected 105, the receiver starts checking for the first 109 of n 111 standard TCS frequencies using a predictive TCS detector 113. If the TCS frequency is detected 115, note the standard TCS frequency number as the decoded TCS frequency 119. If the TCS frequency is not detected 115, then increment to the next standard TCS frequency 117. Upon completion of checking all the standard TCS frequencies 111, the next channel to scan is selected 107. If a standard TCS frequency is detected 115, then the standard TCS frequency detected is noted as the decoded TCS frequency 119 and receiver is unmuted 121. The decoded TCS frequency can be displayed and used by the radio to answer back. The receiver is unmuted 121 until channel activity ceases 123. When channel activity ceases 123, the next channel to scan is selected 107.

It is highly desirable that a radio providing a scanning feature to scan channels as fast as possible. However, the technique described in FIG. 1 may significantly increase scan time since each standard TCS frequency is sequentially checked when RF channel activity is detected. Thus, the need exists to provide a method of efficiently scanning channels in which the determination of an unknown TCS frequency on a channel is required.

DETAILED DESCRIPTION OF THE PREFERRED EMBODIMENT

Figure 1:
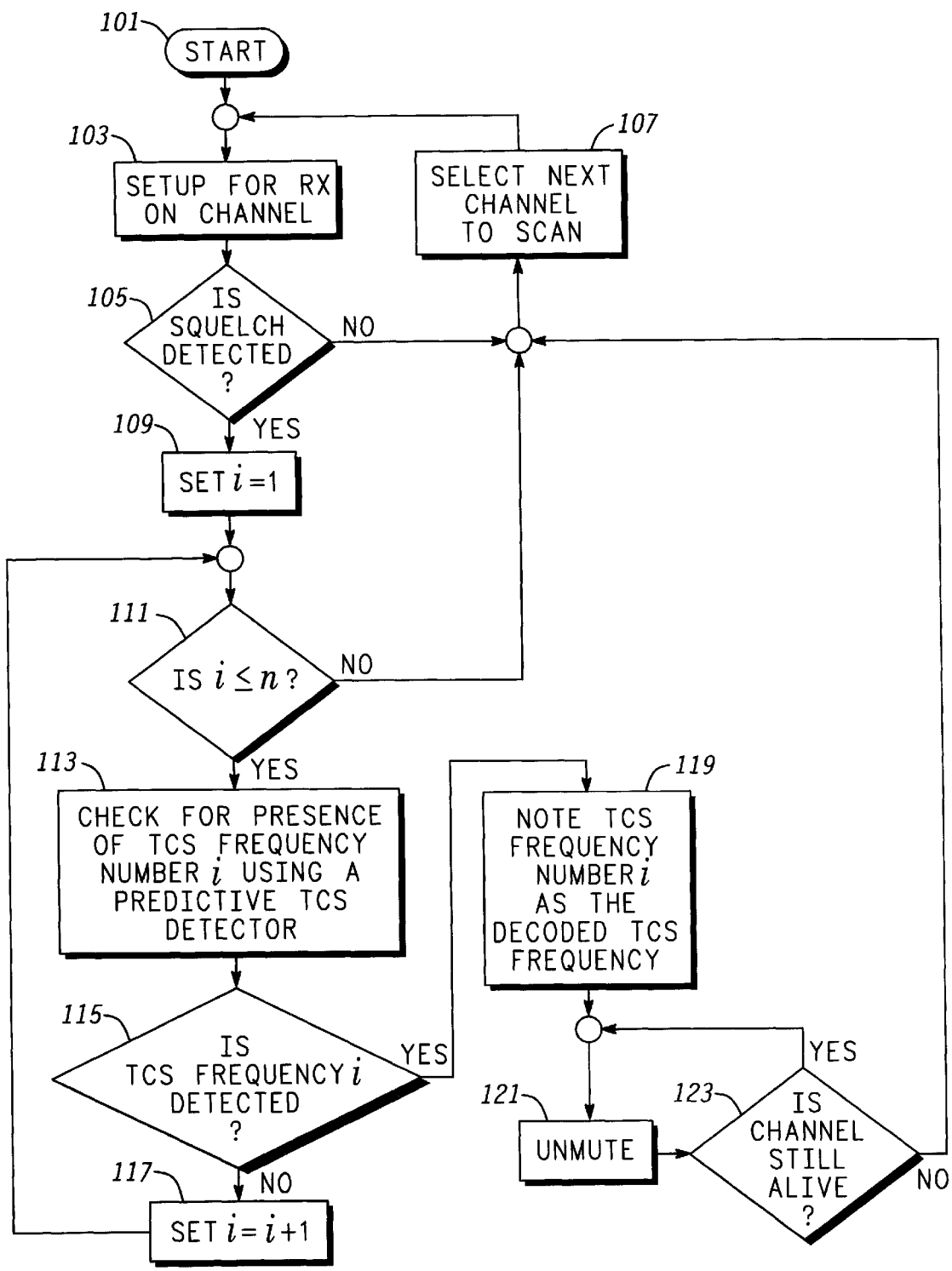
FIG. 1 is a prior art flow chart diagram showing a conventional scan technique that determines an unknown TCS frequency on a radio channel utilizing a sequential search with a predictive TCS frequency detector.
Figure 2:
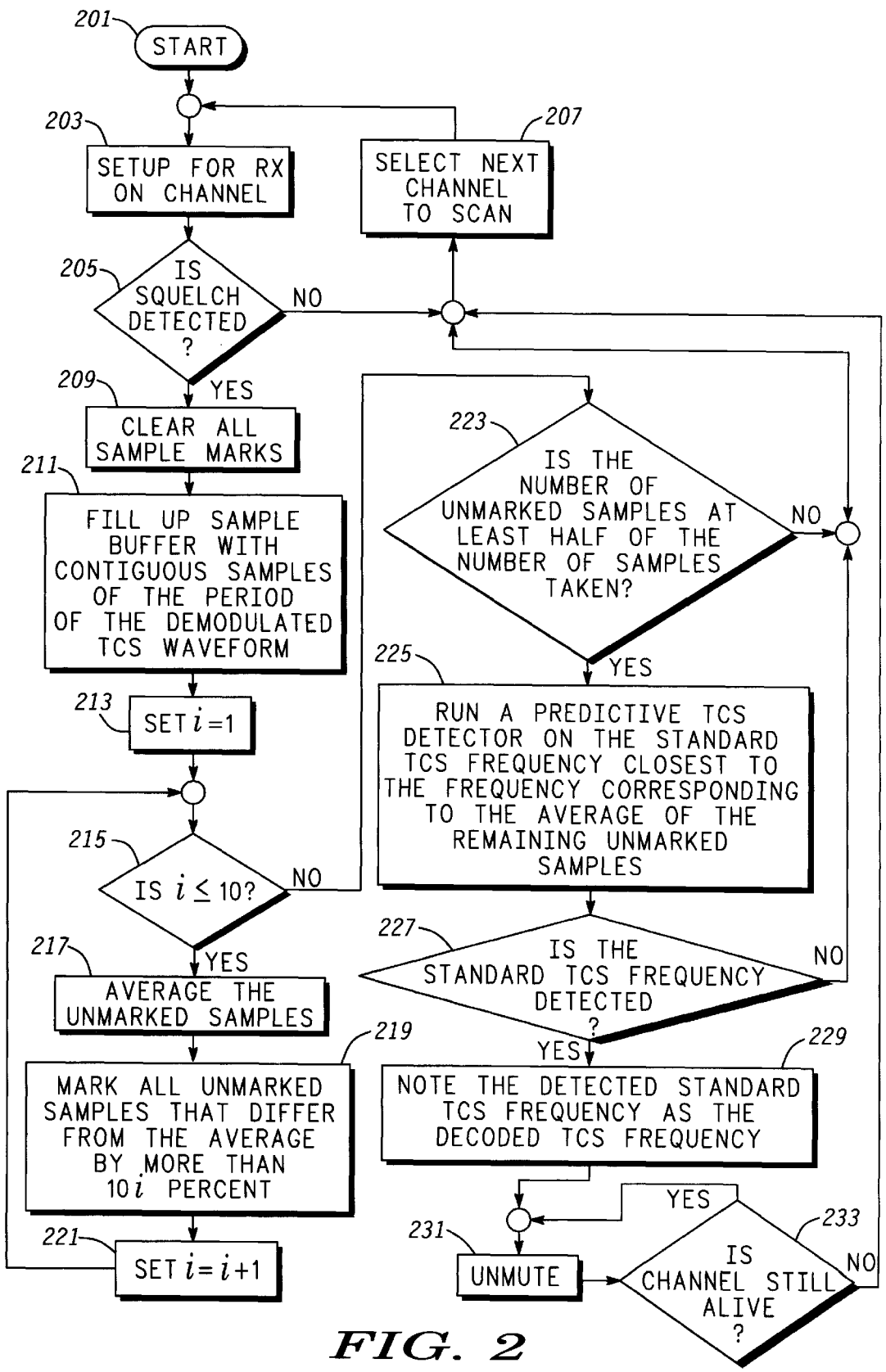
FIG. 2 is a flow chart diagram according to the present invention showing a technique that determines an unknown TCS frequency on a radio channel.

Referring now to FIG. 2, scanning starts 201 where the receiver is set up on a specific radio channel 203. If no radio RF carrier 205 is detected, the next channel is selected 207 and the receiver is set up on the next channel 203. The channels are scanned iteratively 203, 205, 207 from a list until a carrier is detected. Upon completion of scanning the list, scanning continues again from the beginning of the list. If an RF carrier is detected 205, determination of the presence of a standard TCS frequency begins 209. A sample buffer that holds a set of demodulated TCS waveform period samples is initialized 211 with real contiguous demodulated subaudible waveform periods. Each sample in the buffer has a corresponding "marked" flag that is initially cleared 209. The "marked" flag, when set, indicates that the corresponding sample has been discarded. Otherwise, if the "marked" flag is clear, the corresponding sample is still being considered. After taking the set of samples 211, a counter is started 213 and initialized to one. The out-lying samples are iteratively marked 215, 217, 219, 221. This marking of samples is done by first averaging all the unmarked samples 217. Then, all the unmarked samples that differ from the most recently calculated average by more than the quantity ten times the counter percent are marked 219. The counter is incremented 221, and the process repeats until the counter exceeds ten 215. When the counter exceeds ten 215, if the number of remaining unmarked samples is not at least half of the original number of samples taken 223, then no standard TCS frequency is decoded and the next channel to scan is selected 207. If the number of remaining unmarked samples is at least half of the original number of samples taken 223, then a traditional predictive TCS detector is run on the standard TCS frequency closest to the frequency corresponding to the average of the remaining unmarked samples 225. If the predictive TCS detector fails to detect 227, then no standard TCS frequency is decoded and the next channel to scan is selected 207. If the predictive TCS detector detects 227, then the standard TCS frequency detected is noted as the decoded TCS frequency 229 and receiver is unmuted 231. The decoded TCS frequency can be displayed and used by the radio to answer back. The receiver is unmuted 231 until channel activity ceases 233. When channel activity ceases 233, the next channel to scan is selected 207.

Thus, the present invention extends the conventional methods of determining an unknown TCS frequency by taking a single set of TCS waveform period samples and methodically removing the out-lying samples. The initial reduction is achieved by averaging the samples and marking all samples that are more than 10% away from the current unmarked sample average. The reduction continues iteratively by re-averaging the remaining unmarked samples and marking any unmarked samples that are more than 20%, 30%, . . . , and 100% away from the current average. Upon completion of the reduction, if more than half the original number of samples remain unmarked, a predictive TCS detector is run using the standard TCS frequency closest to the corresponding average of the remaining unmarked samples. If the predictive TCS detector detects, then the standard TCS frequency is noted as the decoded TCS frequency.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of determining an unknown modulated tone frequency in a radio frequency receiver comprising the steps of:

detecting a radio frequency signal on a predetermined channel;

clearing all sample marks from a sample buffer;

entering data into a sample buffer having contiguous samples of the demodulated tone signal waveform;

averaging the data in the sample buffer to provide an average data sample;

iteratively marking all the samples that differ from the average data sample by some predetermined percentage and re-averaging the remaining unmarked samples, providing a new average data sample;

determining if the number of unmarked samples remaining is at least some predetermined percentage of the number of data samples taken;

operating a predictive detector looking for a standard tone frequency closest to the frequency corresponding to the average of the remaining unmarked samples if the number of unmarked samples remaining is at least some predetermined percentage of the number of data samples taken;

indicating that no standard tone frequency is detected if the number of unmarked samples remaining is less than some predetermined percentage of the number of data samples taken or if the standard tone frequency is not detected by the predictive detector; and returning the standard tone frequency if the standard tone frequency is detected by the predictive detector.

2. A method of detecting a standard tone-coded squelch frequency for a radio receiver comprising the steps of:

monitoring a channel for a radio frequency carrier;

sampling the demodulated subaudible waveform for some predetermined amount of time;

averaging the samples;

removing all out-lying samples relative to the average, updating the average as each out-lying sample is removed;

determining if there is at least a predetermined number of samples remaining;

running a predicative tone-coded squelch detector on the standard tone-coded squelch frequency corresponding to the average of the remaining samples if there is at least a predetermined number of samples remaining; and returning the standard tone-coded squelch frequency if the standard tone-coded squelch frequency is detected by the predictive detector.

3. A method of scanning a plurality of radio frequency channels in a radio receiver and determining the presence of a standard tone-coded squelch frequency on the radio frequency channel comprising the steps of:

determining a mathematical average of a plurality of subaudible tone samples from a radio frequency channel;

removing out-lying samples that differ from the mathematical average by some predetermined amount;

determining if the number of remaining samples is at least some predetermined percentage of the total samples taken;

using a predictive tone-coded squelch detector to look for the standard tone-coded squelch frequency nearest to the frequency corresponding to the mathematical average of the remaining samples if the number of remaining samples is at least some predetermined percentage of the total samples taken; and returning the standard tone-coded squelch frequency if detected by the predictive detector.

* * * * *